United States Patent
Cheng et al.

(10) Patent No.: US 6,743,715 B1
(45) Date of Patent: Jun. 1, 2004

(54) DRY CLEAN PROCESS TO IMPROVE DEVICE GATE OXIDE INTEGRITY (GOI) AND RELIABILITY

(75) Inventors: Juing-Yi Cheng, Chi-Shan Jen (TW); Yu Bin Huang, Tainan (TW); Yu Hwa Lee, Hsinchu (TW); Chin Shiung Ho, Sunnyvale, CA (US)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 49 days.

(21) Appl. No.: 10/140,645

(22) Filed: May 7, 2002

(51) Int. Cl.[7] .......................................... H01L 21/4763
(52) U.S. Cl. ..................... 438/649; 438/636; 438/637; 438/648; 438/675; 438/682; 438/685; 438/706; 438/710; 438/721
(58) Field of Search .................... 438/636, 637, 438/648, 649, 675, 682, 685, 706, 710, 721

(56) References Cited

U.S. PATENT DOCUMENTS

| | | | |
|---|---|---|---|
| 4,863,559 A | * 9/1989 | Douglas | 438/709 |
| 5,026,666 A | * 6/1991 | Hills et al. | 438/301 |
| 5,998,292 A | 12/1999 | Black et al. | 438/618 |
| 6,194,296 B1 | 2/2001 | Lien | 438/592 |
| 6,207,492 B1 | * 3/2001 | Tzeng et al. | 438/241 |
| 6,218,311 B1 | 4/2001 | McKee et al. | 438/719 |
| 6,277,733 B1 | * 8/2001 | Smith | 438/636 |

* cited by examiner

*Primary Examiner*—Kamand Cuneo
*Assistant Examiner*—Lisa Kilday
(74) *Attorney, Agent, or Firm*—George O. Saile; Stephen B. Ackerman

(57) ABSTRACT

A method for forming a gate silicide portion comprising the following steps. A substrate having a gate oxide layer formed is provided. A gate layer is formed over the gate oxide layer. An RPO layer is formed over the gate layer. A patterned photoresist layer is formed over the RPO layer exposing a portion of the RPO layer. The portion of the RPO layer having a patterned photoresist residue thereover. The structure is subjected to a dry plasma or gas treatment to clean the exposed portion of the RPO layer and removing the patterned photoresist residue. The RPO layer is etched using the patterned photoresist layer as a mask to expose a portion of the gate layer. The dry plasma or gas treatment preventing formation of defects or voids in the RPO layer and the poly gate layer during etching of the RPO layer. A metal layer is formed over at least the exposed portion of the gate layer. The structure is annealed to convert at least a portion of the metal layer and at least a portion of the underlying portion of the gate layer to form a gate silicide portion.

30 Claims, 2 Drawing Sheets

US 6,743,715 B1

DRY CLEAN PROCESS TO IMPROVE DEVICE GATE OXIDE INTEGRITY (GOI) AND RELIABILITY

BACKGROUND OF THE INVENTION

As semiconductor devices and circuits are scaled down to sub-0.25 μm for VLSI technology, the gate oxide is thinner than about 50 Å and its quality becomes more and more important. However, it has been found that the polysilicon/silicon gate is etched and penetrated after HF solution etch processes. This attacks the gate oxide film and results in gate oxide failure making is difficult to maintain device control and the device easily breaks down or becomes leaky. Thus, in order to improve device performance and reliability, gate oxide integrity improvement becomes very important.

U.S. Pat. No. 6,207,492 to Tzeng et al. describes a salicide process and a rapid process oxidation (RPO) process in forming logic devices with salicide shapes on gate structures and on heavily doped source/drain regions with simultaneously forming embedded DRAM devices with salicide shapes only on gate structures.

U.S. Pat. No. 6,218,311 to McKee et al. describes a post-etch treatment of an etch-damaged semiconductor device that includes forming a protective cover over an oxidizable section of the semiconductor device.

U.S. Pat. No. 5,998,292 to Black et al. describes a method for interconnecting, through high-density micro-post wiring, multiple semiconductor wafers with lengths of about a millimeter or below.

U.S. Pat. No. 6,194,296 to Lien describes polycide structures and method for making the same.

SUMMARY OF THE INVENTION

Accordingly, it is an object of an embodiment of the present invention to provide an improved cleaning process to improve device gate oxide integrity.

Other objects will appear hereinafter.

It has now been discovered that the above and other objects of the present invention may be accomplished in the following manner. Specifically, a substrate having a gate oxide layer formed is provided. A gate layer is formed over the gate oxide layer. An RPO layer is formed over the gate layer. A patterned photoresist layer is formed over the RPO layer exposing a portion of the RPO layer. The portion of the RPO layer having a patterned photoresist residue thereover. The structure is subjected to a dry plasma or gas treatment to clean the exposed portion of the RPO layer and removing the patterned photoresist residue. The RFO layer is etched using the patterned photoresist layer as a mask to expose a portion of the gate layer. The dry plasma or gas treatment preventing formation of defects or voids in the RPO layer and the poly gate layer during etching of the RPO layer. A metal layer is formed over at least the exposed portion of the gate layer. The structure is annealed to convert at least a portion of the metal layer and at least a portion of the underlying portion of the gate layer to form a gate silicide portion.

BRIEF DESCRIPTION OF THE DRAWINGS

The present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENT

Unless otherwise specified, all structures, layers, steps, methods, etc. may be formed or accomplished by conventional steps or methods known in the prior art.

Initial Structure

Figure 1:
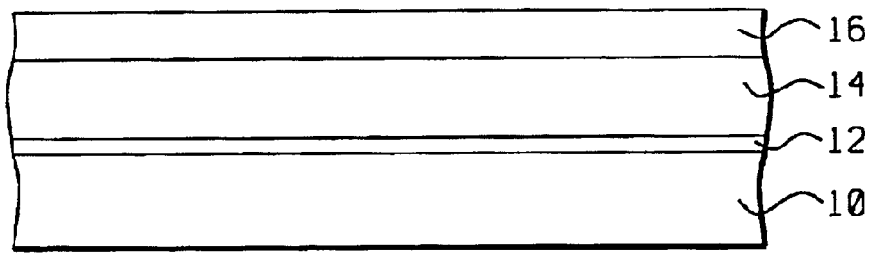
FIGS. 1 to 6 schematically illustrate a preferred embodiment of the present invention.

As shown in FIG. 1, substrate 10 is preferably a semiconductor substrate comprised of silicon, germanium, Ga or As and is more preferably comprised of silicon. Gate oxide layer 12 is formed over substrate 10 to a thickness of from about 5 to 200 Å and more preferably from about 5 to 100 Å. Gate oxide layer is preferably comprised of silicon oxide.

Gate layer 14 is formed over gate oxide layer 12 to a thickness of from about 200 to 3000 Å and more preferably from about 500 to 2000 Å. gate layer 14 is preferably formed of silicon (Si), a metal or silicide and is more preferably silicon.

Rapid oxide oxidation (RPO) layer 16 is formed over poly gate layer 14 to a thickness of from about 50 to 500 Å and more preferably from about 100 to 400 Å. RPO layer 16 is preferably a chemical vapor deposition (CVD) silicon oxide, plasma enhanced chemical vapor deposition (PECVD) silicon oxide or low pressure chemical vapor deposition (LPCVD) silicon oxide and is more preferably PECVD oxide. P+ source/drain implants may be performed into substrate 10 before formation of RPO oxide layer 16 over poly gate layer 14.

Formation of Patterned Photoresist Layer 18

Figure 2:
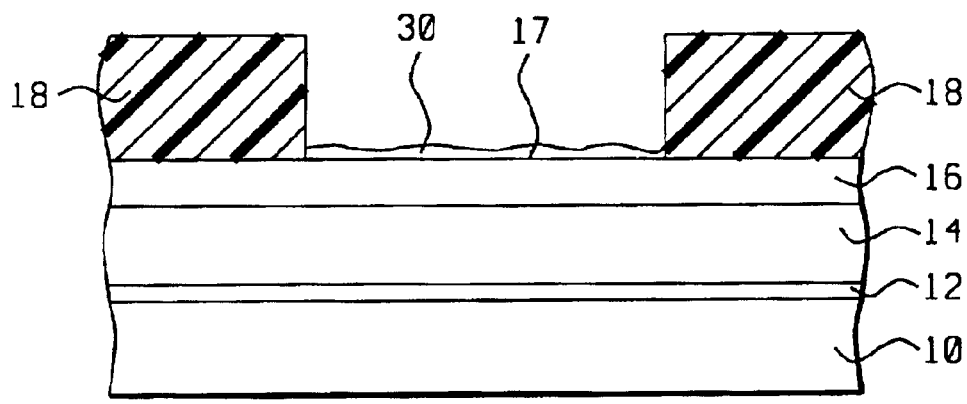

As shown in FIG. 2, a patterned photoresist layer 18 is formed over RPO layer 16 exposing a portion 17 of RPO layer 16 where it is desired to form silicide. The patterning of photoresist layer 18 leaves a patterned photoresist residue 30 over the surface of the exposed portion 17 of RPO layer 16.

Dry Plasma or Gas Treatment 20—Key Step of the Invention

Figure 3:
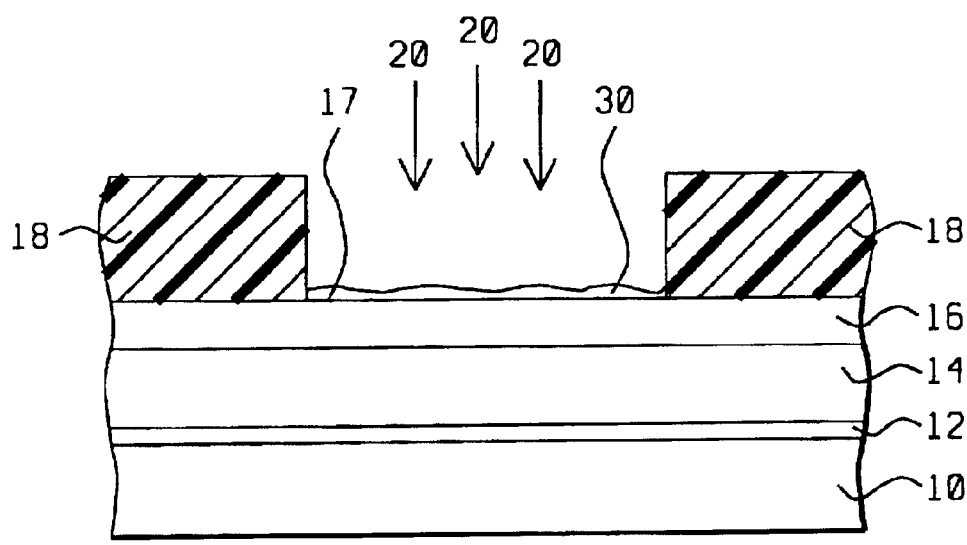

In a key step of the invention and as shown in FIG. 3, the structure of FIG. 2 is subjected to a dry plasma or gas treatment 20 that: (1) removes patterned photoresist residue 30 and cleans the surface of the exposed portion 17 of RPO layer 16 and (2) prevents defects or voids in the RPO oxide layer 16 and/or the poly gate layer 14 during the subsequent wet etch (see below and FIG. 4). Treatment 20 passivates the damage or defect caused from implantation or film deposition.

The plasma or gas treatment 20 is preferably performed in a CVD chamber or a dry photoresist strip chamber. The plasma or gas treatment 20 may be performed simultaneously with, or immediately subsequent to the patterning of photoresist layer 18.

Treatment 20 is preferably comprised of oxygen ($O_2$) gas, $O_2$ plasma, $N_2$ plasma or $H_2$ plasma and is more preferably comprised of $O_2$ plasma. Treatment 20 is conducted at the following conditions:

gas flow rates: $O_2$ gas: from about 1 to 2000 sccm;

$N_2$ gas: from about 1 to 2000 sccm;

temperature: from about 25 to 4000° C.;

RF power: from about 100 to 2000W; and time: from about 1 to 100 seconds.

Etching of RPO layer 16

Figure 4:
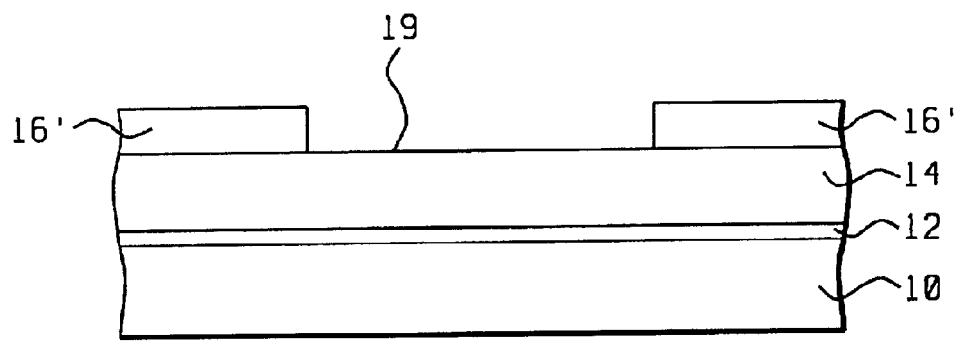

As shown in FIG. 4, RPO layer 16 is etched to form patterned RPO layer 16' using patterned photoresist layer 18 as a mask. The RPO layer 16 etch is preferably an HF solution wet etch and exposes a portion 19 of poly gate layer 14.

Due to the previous plasma or gas treatment 20, defects or voids in the RPO layer 16 and/or the poly gate layer 14 are avoided subsequent to the wet HF solution wet etch of RPO layer 16. This protects the underlying gate oxide layer 12 by preventing penetration of poly gate layer 14 due to the wet HF solution wet etch.

Formation of Metal Layer 22

Figure 5:
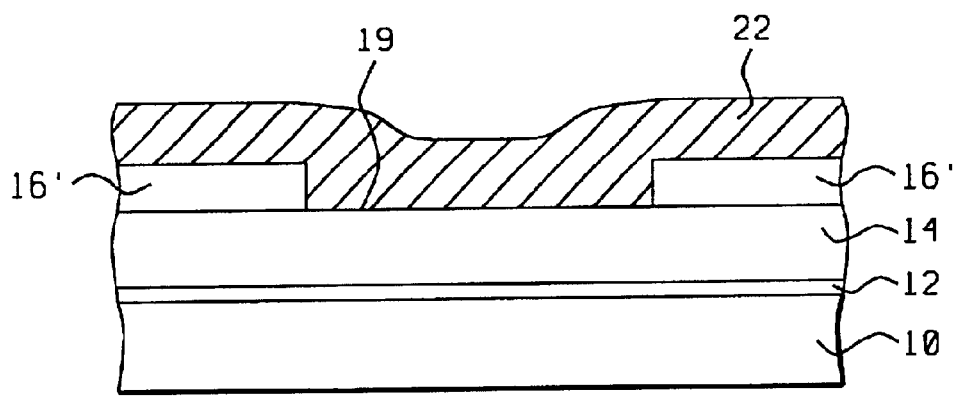
Figure 6:
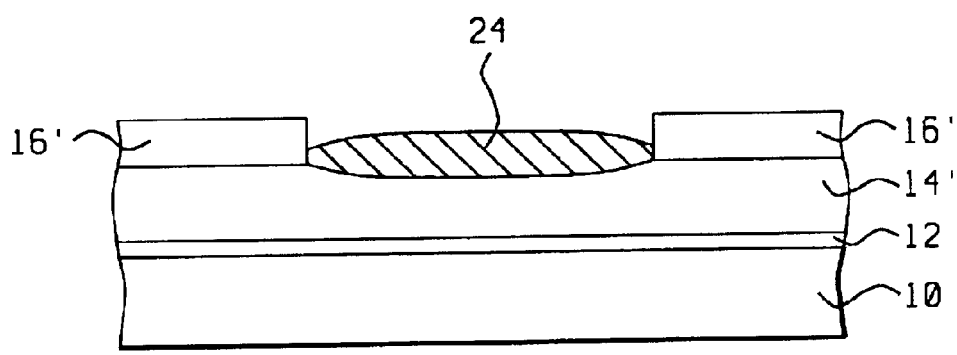

As shown in FIG. 5, a metal layer 22 is formed over the structure of FIG. 4 and over the exposed portion 19 of poly gate layer 14 to a thickness of preferably from about 100 to 3000 Å, more preferably from about 500 to 2000 and more preferably from about 500 to 1500 Å. Metal layer 22 is preferably comprised of copper (Cu), nickel (Ni), titanium (Ti), tungsten (W), gold (Au), silver (Ag) or aluminum (Al).

Formation of Silicide Portion 24

The structure is then annealed to form silicide portion 24 formed from a portion of poly gate layer 14 and adjacent metal layer 22. Silicide portion 24 has a thickness of preferably from about 100 to 2000 Å and more preferably from about 500 to 1500 Å.

The unreacted metal from metal layer 22 is removed, exposing silicide portion 24.

Further processing may then proceed.

Advantages of the Present Invention

The advantages of the present invention include:
1. reduction of gate oxide leakage;
2. improvement of the gate oxide and/or device reliability;
3. improvement of the device and circuit yield;
4. simple process; and
5. prevention of void/defect formation.

While particular embodiments of the present invention have been illustrated and described, it is not intended to limit the invention, except as defined by the following claims.

We claim:

1. A method for forming a gate silicide portion, comprising the sequential steps of:
   providing a substrate having a gate oxide layer formed thereover;
   forming a gate layer over the gate oxide layer;
   forming an RPO layer over the gate layer;
   forming a patterned photoresist layer over the RPO layer exposing a portion of the RPO layer; the portion of the RPO layer having a patterned photoresist residue thereover;
   subjecting the structure to a dry plasma or gas treatment to clean the exposed portion of the RPO layer and removing the patterned photoresist residue;
   etching the RPO layer using the patterned photoresist layer as a mask to expose a portion of the gate layer; the dry plasma or gas treatment preventing formation of defects or voids in the RPO layer and the poly gate layer during etching of the RPO layer;
   forming a metal layer over at least the exposed portion of the gate layer; and
   annealing the structure to convert at least a portion of the metal layer and at least a portion of the underlying portion of the gate layer to form a gate silicide portion.

2. The method of claim 1, wherein the substrate is a semiconductor substrate comprised of a material selected from the group consisting of silicon, germanium, Ga and As; the gate layer is comprised of a material selected from the group consisting of silicon, metal and silicide; the RPO layer is comprised of a material selected from the group consisting of CVD silicon oxide, PECVD silicon oxide and LPCVD silicon oxide; and the metal layer is comprised of a material selected from the group consisting of Cu, Ni, Ti, W, Au, Ag and Al.

3. The method of claim 1, wherein the substrate is a silicon semiconductor substrate; gate layer is comprised of silicon; the RPO layer is comprised of PECVD silicon oxide; and the metal layer is comprised of a material selected from the group consisting of Cu, Ni, Ti, W, Au, Ag and Al.

4. The method of claim 1, including the step of forming source/drain implants into the substrate after formation of the gate layer and before formation of the RPO layer.

5. The method of claim 1, wherein the gate oxide layer is from about 5 to 200 Å thick; the gate layer is from about 200 to 3000 Å; the RPO layer is from about 50 to 500 Å thick; the metal layer is from about 100 to 3000 Å thick; and the silicide portion is from about 100 to 2000 Å thick.

6. The method of claim 1, wherein the gate oxide layer is from about 5 to 100 Å thick; gate layer is from about 500 to 2000 Å; the RPO layer is from about 100 to 400 Å thick; the metal layer is from about 500 to 2000 Å thick; and the silicide portion is from about 500 to 1500 Å thick.

7. The method of claim 1, wherein the dry plasma or gas treatment is conducted in a CVD chamber or a dry photoresist strip chamber.

8. The method of claim 1, wherein the dry plasma or gas treatment is a dry plasma treatment conducted using a material selected from the group consisting of $O_2$ plasma, $N_2$ plasma or $H_2$ plasma.

9. The method of claim 1, wherein the dry plasma or gas treatment is a dry plasma treatment conducted at the following conditions:
   $O_2$ gas: from about 1 to 2000 sccm;
   $N_2$ gas: from about 1 to 2000 sccm;
   temperature: from about 25 to 4000° C.; and
   RP power: from about 100 to 2000W;
   time: from about 1 to 100 seconds.

10. The method of claim 1, wherein the dry plasma or gas treatment is a dry gas treatment using $O_2$.

11. A method for forming a gate silicide portion, comprising the sequential steps of:
   providing a silicon semiconductor substrate having a gate oxide layer formed thereover;
   forming a gate layer over the gate oxide layer;
   forming an RPO layer over the gate layer;
   forming a patterned photoresist layer over the RPO layer exposing a portion of the RPO layer; the portion of the RPO layer having a patterned photoresist residue thereover;
   subjecting the structure to a dry plasma or gas treatment to clean the exposed portion of the RPO layer and removing the patterned photoresist residue;
   etching the RPO layer using the patterned photoresist layer as a mask to expose a portion of the gate layer; the dry plasma or gas treatment preventing formation of defects or voids in the RPO layer and the poly gate layer during etching of the RPO layer;
   forming a metal layer over at least the exposed portion of the gate layer; and
   annealing the structure to convert at least a portion of the metal layer and at least a portion of the underlying portion of the gate layer to form a gate silicide portion.

12. The method of claim 11, wherein the gate layer is comprised of a material selected from the group consisting of silicon, metal and silicide; the RPO layer is comprised of a material selected from the group consisting of CVD silicon oxide, PECVD silicon oxide and LPCVD silicon oxide; and the metal layer is comprised of a material selected from the group consisting of Cu, Ni, Ti, W, Au, Ag and Al.

13. The method of claim 11, wherein the gate layer is comprised of silicon; the RPO layer is comprised of PECVD silicon oxide; and the metal layer is comprised of a material selected from the group consisting of Cu, Ni, Ti, W, Au, Ag and Al.

14. The method of claim 11, including the step of forming source/drain implants into the silicon semiconductor substrate after formation of the gate layer and before formation of the RPO layer.

15. The method of claim 11, wherein the gate oxide layer is from about 5 to 200 Å thick; the gate layer is from about 200 to 3000 Å; RPO layer is from about 50 to 500 Å thick; the metal layer is from about 500 to 3000 Å thick; and the silicide portion is from about 100 to 2000 Å thick.

16. The method of claim 11, wherein the gate oxide layer is from about 5 to 100 Å thick; gate layer is from about 500 to 2000 Å; the RPO layer is from about 100 to 400 Å thick; the metal layer is from about 500 to 2000 Å thick; and the silicide portion is from about 500 to 1500 Å thick.

17. The method of claim 11, wherein the dry plasma or gas treatment is conducted in a CVD chamber or a dry photoresist strip chamber.

18. The method of claim 11, wherein the dry plasma or gas treatment is a dry plasma treatment conducted using a material selected from the group consisting of $O_2$ plasma, $N_2$ plasma or $H_2$ plasma.

19. The method of claim 11, wherein the dry plasma or gas treatment is a dry plasma treatment conducted at the following conditions:

$O_2$ gas: from about 1 to 2000 sccm;

$N_2$ gas: from about 1 to 2000 sccm;

temperature: from about 25 to 4000° C.; and

RF power: from about 100 to 2000W;

time: from about 1 to 100 seconds.

20. The method of claim 11, wherein the dry plasma or gas treatment is a dry gas treatment using $O_2$.

21. A method for forming a gate silicide portion, comprising the sequential steps of:

providing a silicon semiconductor substrate having a gate oxide layer formed thereover;

forming a gate layer over the gate oxide layer; wherein the gate layer is comprised of a material selected from the group consisting of silicon, metal and silicide;

forming an RPO layer over the gate layer; wherein the RPO layer is comprised of a material selected from the group consisting of: CVD silicon oxide; PECVD silicon oxide and LPCVD silicon oxide;

forming a patterned photoresist layer over the RPO layer exposing a portion of the RPO layer; the portion of the RPO layer having a patterned photoresist residue thereover;

subjecting the structure to a dry plasma or gas treatment to clean the exposed portion of the RPO layer and removing the patterned photoresist residue;

etching the RPO layer using the patterned photoresist layer as a mask to expose a portion of the gate layer; the dry plasma or gas treatment preventing formation of defects or voids in the RPO layer and the poly gate layer during etching of the RPO layer;

forming a metal layer over at least the exposed portion of the gate layer; wherein the metal layer is comprised of a material selected from the group consisting of Cu, Ni, Ti, W, Au, Ag and Al; and annealing the structure to convert at least a portion of the metal layer and at least a portion of the underlying portion of the gate layer to form a gate silicide portion.

22. The method of claim 21, wherein the gate layer is comprised of silicon; and the RPO layer is comprised of PECVD silicon oxide.

23. The method of claim 21, including the step of forming source/drain implants into the silicon semiconductor substrate after formation of the gate layer and before formation of the RPO layer.

24. The method of claim 21, wherein the gate oxide layer is from about 5 to 200 Å thick; the gate layer is from about 200 to 3000 Å; RPO layer is from about 50 to 500 Å thick; the metal layer is from about 500 to 3000 Å thick; and the silicide portion is from about 100 to 2000 Å thick.

25. The method of claim 21, wherein the gate oxide layer is from about 5 to 100 Å thick; gate layer is from about 500 to 2000 Å; the RPO layer is from about 100 to 400 Å thick; the metal layer is from about 500 to 2000 Å thick; and the silicide portion is from about 500 to 100 Å thick.

26. The method of claim 21, wherein the dry plasma or gas treatment is conducted in a CVD chamber or a dry photoresist strip chamber.

27. The method of claim 21, wherein the dry plasma or gas treatment is a dry plasma treatment conducted using a material selected from the group consisting of $O_2$ plasma, $N_2$ plasma or $H_2$ plasma.

28. The method of claim 21, wherein the dry plasma or gas treatment is a dry plasma treatment conducted at the following conditions:

$O_2$ gas: from about 1 to 2000 sccm;

$N_2$ gas: from about 1 to 2000 sccm;

temperature: from about 25 to 4000° C.; and

RF power: from about 100 to 2000W;

time: from about 1 to 100 seconds.

29. The method of claim 21, wherein the dry plasma or gas treatment is a dry gas treatment using $O_2$.

30. The method of claim 21, wherein the dry plasma or gas treatment is a dry plasma treatment conducted in a CVD chamber or a dry photoresist strip chamber at the following conditions:

$O_2$ gas: from about 1 to 2000 sccm;

$N_2$ gas: from about 1 to 2000 sccm;

temperature: from about 25 to 4000° C.; and

RF power: from about 100 to 2000W;

time: from about 1 to 100 seconds.

\* \* \* \* \*